(12) United States Patent
Evans et al.

(10) Patent No.: US 11,038,459 B2
(45) Date of Patent: Jun. 15, 2021

(54) TEMPERATURE COMPENSATED OSCILLATOR

(71) Applicant: eoSemi Limited, Cheshire (GB)

(72) Inventors: Iwan Gwynfor Evans, Greater Manchester (GB); George Hedley Storm Rokos, Greater London (GB)

(73) Assignee: eoSemi Limited, Cheshire (GB)

( * ) Notice: Subject to any disclaimer, the term of this patent is extended or adjusted under 35 U.S.C. 154(b) by 0 days.

(21) Appl. No.: 16/936,939

(22) Filed: Jul. 23, 2020

(65) Prior Publication Data

US 2020/0358397 A1 Nov. 12, 2020

Related U.S. Application Data

(63) Continuation of application No. PCT/GB2018/053435, filed on Nov. 28, 2018.

(30) Foreign Application Priority Data

Jan. 25, 2018 (GB) ...................................... 1801241

(51) Int. Cl.
| | |
|---|---|
| *H03B 5/04* | (2006.01) |
| *H03B 5/32* | (2006.01) |
| *H03B 1/02* | (2006.01) |
| *H03L 1/02* | (2006.01) |

(52) U.S. Cl.
CPC ................. *H03B 5/04* (2013.01); *H03B 5/32* (2013.01); *H03L 1/022* (2013.01); *H03L 1/028* (2013.01); *H03B 2202/05* (2013.01)

(58) Field of Classification Search
CPC ........... H03L 1/022; H03L 1/028; H03B 5/04; H03B 5/32; H03B 2200/05
USPC .......................................... 331/176, 167, 158
See application file for complete search history.

(56) References Cited

U.S. PATENT DOCUMENTS

| | | | |
|---|---|---|---|
| 9,470,726 B2 | 10/2016 | Hackett | |
| 2010/0045394 A1* | 2/2010 | Hanafi | ..................... H03L 1/022 |
| | | | 331/167 |
| 2017/0149411 A1* | 5/2017 | Nielsen | .............. H03H 11/1291 |

FOREIGN PATENT DOCUMENTS

| | | |
|---|---|---|
| EP | 0744836 | 11/1996 |
| EP | 1641123 | 3/2006 |
| WO | WO 2019/145666 | 8/2019 |

* cited by examiner

*Primary Examiner* — Arnold M Kinkead
(74) *Attorney, Agent, or Firm* — Levine Bagade Han LLP

(57) ABSTRACT

Temperature compensated oscillators are provided. The oscillator comprises an oscillator circuit and a temperature compensation module. The temperature compensation module reduces temperature induced errors in the frequency of oscillation of the oscillator by providing a temperature compensation signal to the oscillator circuit based on a temperature sensor output. The temperature compensation module comprises a low pass filter configured to reduce noise in the temperature compensation signal. The low pass filter is such that, using Laplace representations of transfer functions, the transfer function H(s) of the filter is equivalent to the transfer function of a closed loop configuration in which a module having an open loop transfer function G(s) is configured to generate an output from the closed loop configuration by applying the open loop transfer function G(s) to an error between an input to the closed loop configuration and the output from the closed loop configuration.

14 Claims, 2 Drawing Sheets

TEMPERATURE COMPENSATED OSCILLATOR

CROSS-REFERENCE TO RELATED APPLICATIONS

This application is a continuation International Patent Application Number PCT/GB2018/053435 filed Nov. 28, 2018, which claims the benefit of priority to GB 1801241.9 filed Jan. 25, 2018, the contents of which are incorporated herein by reference in their entireties.

BACKGROUND OF THE INVENTION

The present invention relates to a temperature compensated oscillator, particularly a temperature compensated oscillator using an oscillator circuit to drive a piezoelectric resonator such as a quartz crystal.

Quartz crystal oscillators are well known. The frequency of such oscillators is governed by the quartz crystal, but can be influenced (pulled) by the capacitive load presented by the oscillator circuit. This allows the oscillator to provide a clock with a relatively stable frequency. However, the properties of the circuit, and in particular the crystal, mean that the clock frequency will vary with temperature. Clock frequencies provided by other types of oscillator may also vary with temperature for similar reasons.

Temperature compensation aims to eliminate the variation in oscillator clock frequency by measuring the temperature and adjusting the oscillator load capacitance to keep the clock at the desired frequency. The adjustment may use known temperature characteristics of the oscillator, for example known temperature characteristics of the piezoelectric resonator (e.g. quartz crystal).

FIG. 1 shows a typical configuration for a temperature compensated quartz crystal oscillator 101. A temperature sensor 102 measures temperature and provides an output to a temperature compensation module 103. The temperature compensation module 103 provides a temperature compensation signal to an oscillator circuit 104 coupled to a quartz crystal 105 based on the measured temperature.

It has been found that noise from temperature sensors in temperature compensated oscillators can significantly degrade the phase noise of the oscillator output.

It is an object of the invention to provide an improved temperature compensated oscillator.

BRIEF SUMMARY OF THE INVENTION

According to an object of the invention, there is provided a temperature compensated oscillator, comprising: an oscillator circuit; and a temperature compensation module configured to reduce temperature induced errors in the frequency of oscillation of the oscillator by providing a temperature compensation signal to the oscillator circuit based on an output from a temperature sensor, wherein the temperature compensation module comprises a low pass filter configured to reduce noise in the temperature compensation signal, the low pass filter being such that, using Laplace representations of transfer functions, the transfer function $H(s)$ of the filter is equivalent to the transfer function of a closed loop configuration in which a module having an open loop transfer function $G(s)$ is configured to generate an output from the closed loop configuration by applying the open loop transfer function $G(s)$ to an error between an input to the closed loop configuration and the output from the closed loop configuration, wherein $G(s)$ comprises at least one pole at the origin and at least one pole that is not at the origin.

Generally, a sensor within a system will be required to have a defined noise performance. If the sensor does not meet this requirement, a filter will be required with an appropriate bandwidth and roll-off to reduce noise to acceptable levels. Many standard filter topologies exist (e.g. Butterworth, Chebyshev, Bessel) to implement such a filter, each with an inherent relationship between bandwidth and group delay. Any delay in the filter introduces a tracking error between the sensed property and the filtered sensor measurement of the property, which can result in errors in the response of the system to the sensor input.

In the context of a temperature controlled oscillator, the filtering would conventionally be done in the analogue domain. The bandwidth of the filter will generally need to be very low, implying large capacitors that are difficult to integrate in an integrated circuit. This means that simple filters are preferable, and even these may require external components to realize, a significant complication for a temperature controlled oscillator, which is typically a low pin count device.

With a filter implemented in the digital domain, realizing a very low bandwidth low pass filter becomes far less difficult. It also means that higher order filtering can be considered, in addition to considering other techniques that reduce the delay of the filter. The group delay of a filter may be reduced by adjusting the transfer function away from the traditional filter topologies. Introducing complex conjugate poles with higher Q will tend to reduce group delay, at the considerable expense of added peaking in the gain characteristics. Including zeros in the transfer function can also reduce the group delay, but again, peaking will be a potential problem.

Embodiments of the present disclosure use techniques from control theory, but applied to filter design to implement a novel, complex high order filter. This approach affords an efficient implementation of a low pass filter that has zero delay when driven by certain classes of input signal.

The low pass filter provides improved performance and flexibility relative to conventional filters in the context of temperature compensated oscillators by providing a greater degree of decoupling between characteristics that promote good noise rejection (low bandwidth) and characteristics that promote good tracking performance (high bandwidth), which are generally in conflict with each other in standard filters.

In an embodiment, a filter with transfer function $H(s)$ is implemented with an open loop transfer function $G(s)$, which comprises at least two poles at the origin. Providing at least two poles at the origin provides better tracking of certain types of temperature variation, which improves the robustness of the temperature compensation, particular where temperatures are changing relatively quickly as a function of time.

In an embodiment, $G(s)$ comprises two poles at the origin and four poles in total. This configuration has been found to provide a particularly good balance of high filter performance (good noise rejection and tracking) and closed loop stability. Two poles at origin is for tracking, four poles in total is for filter performance (more roll-off). Zeros provide stability. Only having four poles in total makes the loop easier to stabilize with the zeros than if there were 5 poles.

In an embodiment, $G(s)$ comprises m poles at the origin and at least m−1 zeros, optionally exactly m−1 zeros, wherein m is an integer equal to or greater than 2. This requirement provides the basis for a range of filter configurations that provide enhanced performance relative to conventional alternatives while providing closed loop stability and a good balance of ease of manufacture to tracking performance.

BRIEF DESCRIPTION OF THE SEVERAL VIEWS OF THE DRAWINGS

The invention will now be further described, by way of example, with reference to the accompanying drawings, in which.

DETAILED DESCRIPTION OF THE INVENTION

As mentioned above, noise in an output from a temperature sensor can degrade the quality of an output from a temperature compensated oscillator. The temperature sensor noise causes frequency noise at the oscillator output, which becomes phase noise (as phase is the time integral of frequency).

Phase noise is a critical parameter of oscillators. The oscillator has its own intrinsic phase noise, which sets the limit for phase noise performance. Any additional noise added by the temperature sensor should be reduced as far as possible. In embodiments of the present disclosure, phase noise is reduced by filtering.

Figure 1:
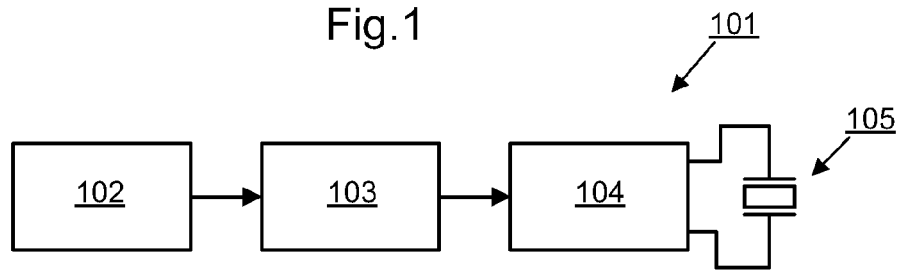
FIG. 1 depicts an example configuration for a temperature compensated quartz crystal oscillator according to the prior art.
Figure 2:
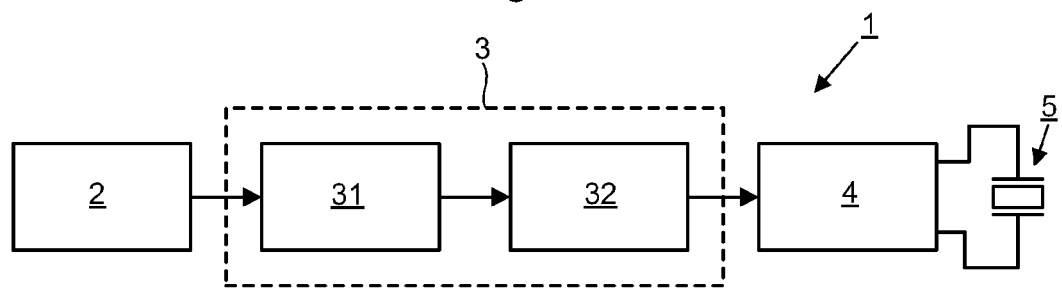
FIG. 2 depicts an example configuration of a temperature compensated oscillator in which a temperature compensation module comprises a low pass filter configured to filter an output from the temperature sensor before generating a temperature compensation signal.
Figure 3:
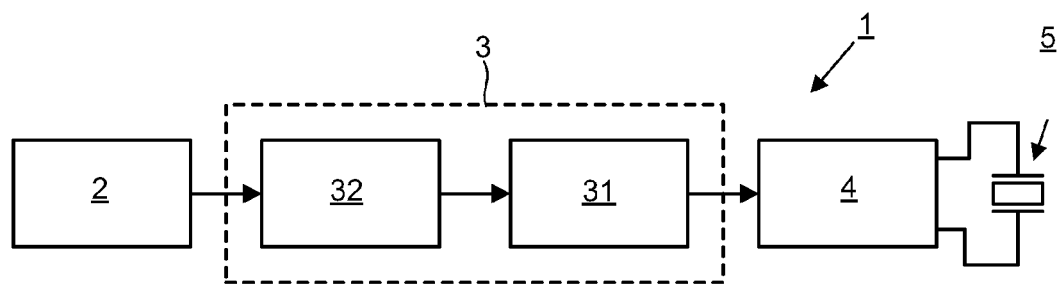
FIG. 3 depicts an example configuration of a temperature compensated oscillator in which a temperature compensation module comprises a low pass filter configured to filter a temperature compensation signal that has already been generated.

Example configurations for a temperature compensated oscillator 1 using filtering to reduce phase noise are depicted in FIGS. 2 and 3. In these configurations (and others), the oscillator 1 comprises a piezoelectric resonator 5 coupled to an oscillator circuit 4. The piezoelectric resonator 5 optionally comprises a quartz crystal. The oscillator 1 further comprises a temperature compensation module 3. The temperature compensation module 3 reduces temperature induced errors in the frequency of oscillation of the oscillator 1 by providing a temperature compensation signal to the oscillator circuit 4 based on an output from a temperature sensor 2. The temperature compensation module 3 comprises a filter 31 that reduces noise in the temperature compensation signal. The temperature compensation module 3 further comprises a temperature compensation signal generation unit 32. The filter 31 may be positioned before the temperature compensation signal generation unit 32, as depicted in FIG. 2, such that the output from the temperature sensor 2 is filtered before the temperature compensation signal is generated. Alternatively, the filter 31 may be positioned after the temperature compensation signal generation unit 32, as depicted in FIG. 3, such that the temperature compensation signal is generated using an unfiltered output from the temperature sensor 2 and is then filtered before being supplied to the oscillator circuit 4. In other embodiments, filters may be provided both before and after the temperature compensation signal generation unit 32.

The basic aim of the filter 31 (or filters) is to reduce noise relative to signal. As described below, however, achieving this noise reduction in a way which contributes optimally to improvement of the oscillator output is challenging. Embodiments of the present disclosure specifically address these challenges.

In many filter designs there is a trade-off between achieving good noise rejection and good tracking. A low filter bandwidth, for example, will favor removal of more noise, allowing the overall phase noise performance to improve, but will tend to have a negative effect on tracking. This is because a low filter bandwidth will normally increase lag, which is typically inversely proportional to the filter bandwidth. The result of lag is that the temperature compensation being applied at any given time is based on the temperature at an earlier time. This is not a problem when the temperature is static but will cause errors when the temperature is changing. The lag is reduced by choosing a higher filter bandwidth.

As a specific example of the problem, consider a standard $1^{st}$ order low pass filter with bandwidth $\omega_o$, which has the following transfer function (using a Laplace representation):

$$H(s) = \frac{1}{1 + s/\omega_o}$$

The group delay (lag) of this filter is given by:

$$\tau(\omega) = \frac{1}{\omega_o}\left(\frac{1}{1 + (\omega/\omega_o)^2}\right)$$

It can be seen that the delay through the filter is inversely proportional to the bandwidth.

Similar issues exist for higher order filters, be they a series of buffered lower order stages, or single stage high order filters. Attempts have been made to counter the measurement lag problem by using the first differential of the temperature as an additional input to the temperature compensation, but the differential of the temperature is a noisier signal than the current temperature, and is therefore likely to degrade oscillator noise performance further.

In an embodiment, the filter 31 is a low pass filter. This is appropriate because noise from the temperature sensor 2 is generally wideband while the signal is usually confined to a certain bandwidth.

Figure 4:
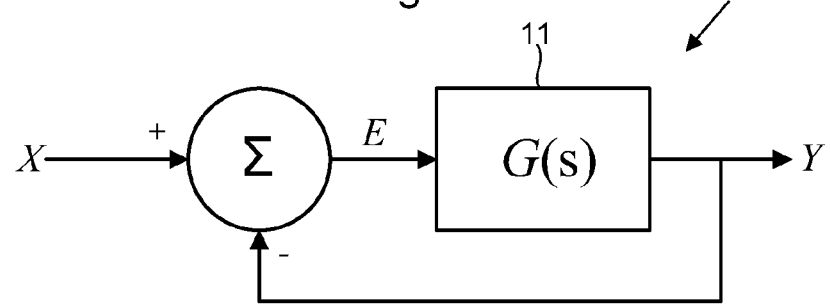
FIG. 4 depicts a closed loop configuration comprising a module having an open loop transfer function G(s)

In an embodiment, the filter 31 is configured such that, using Laplace representations of transfer functions, the transfer function H(s) of the filter is equivalent to the transfer function of a closed loop configuration 10 such as that depicted schematically in FIG. 4. The closed loop configuration 10 comprises a module 11 having an open loop transfer function G(s) and is configured to generate an output Y from the closed loop configuration 10 by applying the open loop transfer function G(s) to an error E between an input X to the closed loop configuration 10 and the output Y from the closed loop configuration 10, wherein G(s) comprises at least one pole at the origin and at least one pole that is not at the origin.

The inventors have found that using a filter 31 having this specific design allows the relationship between noise rejection and good tracking to be decoupled to a greater extent than is achieved using standard filters used in the context of temperature compensated oscillators, thereby allowing the performance of the filter 31 to approach more closely that of an ideal filter (which would reject all noise and track the input signal perfectly as it changes over time) in this context.

The feedback in the closed loop configuration 10 attempts to keep the input X and the output Y identical. The ability of the system output to correctly track the input depends on: 1) the open loop transfer function G(s); and 2) the nature of the applied input X.

In the context of temperature compensated oscillators, it has been found that the applied input X is typically such that arranging for G(s) to have at least one pole at the origin and at least one pole that is not at the origin provides improved performance relative to conventional alternatives.

In the case where the input X is static, if the open loop transfer function G(s) is simply a gain term, then there will be a constant error between the input X and the output Y that is dependent on the magnitude of the gain. Introducing an integrator (origin pole) into the open loop transfer function G(s) integrates the error between the input X and output Y. Thus, when the output Y is stable, the error is zeroed and the input/output tracking is therefore ideal (after initial settling). Where variation in time exists, input/output tracking may be less than ideal (but still acceptable) depending on the degree of variation and the number of origin poles that are provided. The filter design allows flexibility in that tracking can be enhanced where a higher degree of variation in time is expected by adding further origin poles. In the case where the input X has an nth order polynomial variation in time, for example, n integrators in the open loop transfer function would achieve ideal tracking (after initial settling). In an embodiment, G(s) comprises at least two poles at the origin.

The additional one or more poles that are not at the origin in G(s) provide the low pass functionality (a low pass signal transfer function from input to output). In an embodiment, at least two poles are provided that are not at the origin. In an embodiment, G(s) comprises at least two poles at the origin and at least two poles that are not at the origin, optionally exactly two poles at the origin and/or exactly two poles that are not at the origin.

A closed loop system with several poles in the open loop transfer function G(s) as described will have phase shift in the feedback path, which in the absence of zeros can be excessive, resulting in a feedback system with no phase margin, or instability, or positive feedback.

In an embodiment, one or more zeros are provided in the open loop transfer function G(s) to stabilize the loop. The pole and zero locations are selected appropriately to give the desired low pass filter bandwidth whilst maintaining stability.

In an embodiment, G(s) comprises m poles at the origin and at least m−1 zeros (optionally exactly m−1 zeros), wherein m is an integer equal to or greater than 2. In an example of such an embodiment, G(s) is given as follows:

$$G(s) = \frac{k}{s^m} \frac{\prod_{i=1}^{(m-1)}(s-z_i)}{\prod_{j=1}^{(n-m)}(s-p_j)}$$

wherein k is a constant, m is an integer representing the number of poles at the origin, n is an integer representing the number of poles in total, $z_i$ represents the position of each zero, and $p_j$ represents the position of each pole that is not at the origin. The transfer function shown is of type 'm' (m poles at origin), and order 'n' (n total poles). The corresponding closed loop transfer function H(s) is given as follows:

$$H(s) = \frac{Y(s)}{X(s)}$$
$$= \frac{G(s)}{1+G(s)}$$
$$= \frac{k\prod_1^{(m-1)}(s-z_m)}{s^m\prod_1^{(n-m)}(s-p_m) + k\prod_1^{(m-1)}(s-z_m)}$$

An advantage of this filter transfer function H(s) relative to conventional filters used in the context of temperature compensated oscillators is that the presence of the one or more origin poles within G(s) provides enhanced tracking of a range of input classes. This ability can be analyzed by looking at the tracking error transfer function—the ability of the output to track the input, which can be defined as:

$$TETF(s) = \frac{E(s)}{X(s)}$$
$$= \frac{X(s)-Y(s)}{X(s)}$$
$$= \frac{1}{1+G(s)}$$
$$= \frac{s^m\prod_1^{(n-m)}(s-p_m)}{s^m\prod_1^{(n-m)}(s-p_m) + k\prod_1^{(m-1)}(s-z_m)}$$

The ability of the filter transfer function to track inputs in the time domain can be analyzed as follows:

$$\lim_{t\to\infty} e(t) = \lim_{s\to 0} sE(s) = \lim_{s\to 0} sX(s)TETF(s)$$

Some example input waveforms are analyzed in the table below, respectively for: 1) a static input, x(t)=a; 2) a $1^{st}$ order ramp, x(t)=at; 3) an $m^{th}$ order ramp, x(t)=at$^m$; and 4) an $(m+1)^{th}$ order ramp, x(t)=at$^{(m+1)}$.

| x(t) | X(s) = $\mathcal{L}$(x(t)) | sE(s) = sX(s)TETF(s) | Steady State e(t) |
|---|---|---|---|
| a | a/s | $\dfrac{as^m\prod_1^{(n-m)}(s-p_m)}{s^m\prod_1^{(n-m)}(s-p_m)+k\prod_1^{(m-1)}(s-z_m)}$ | 0 |

-continued

| x(t) | X(s) = $\mathcal{L}$(x(t)) | sE(s) = sX(s)TETF(s) | Steady State e(t) |
|---|---|---|---|
| at | $a/s^2$ | $\dfrac{as^{(m-1)}\prod_1^{(n-m)}(s-p_m)}{s^m\prod_1^{(n-m)}(s-p_m)+k\prod_1^{(m-1)}(s-z_m)}$ | 0 (m ≥ 1) |
| $at^m$ | (m − 1)! $a/s^{(m+1)}$ | $\dfrac{(m-1)!\,a\prod_1^{(n-m)}(s-p_m)}{s^m\prod_1^{(n-m)}(s-p_m)+k\prod_1^{(m-1)}(s-z_m)}$ | $a\dfrac{(m-1)!}{k}\dfrac{\prod_1^{(n-m)}(-p_m)}{\prod_1^{(m-1)}(-z_m)}$ |
| $at^{(m+1)}$ | m! $a/s^{(m+2)}$ | $\dfrac{m!\,a\prod_1^{(n-m)}(s-p_m)}{s\left(s^m\prod_1^{(n-m)}(s-p_m)+k\prod_1^{(m-1)}(s-z_m)\right)}$ | ∞ |

This demonstrates that a type 'm' open loop transfer function G(s) can implement a closed loop filter that can track an $(m-1)^{th}$ order ramp with no static error, and an $m^{th}$ order ramp with a fixed static error. Many other input waveform types can also be tracked with zero error.

In an embodiment, G(s) comprises a type 2, $4^{th}$ order transfer function, which has been found to provide a particularly good balance of performance and stability.

In an embodiment, the filter 31 comprises the closed loop configuration described above. Alternatively, the filter 31 may be configured such that the transfer function H(s) is achieved without actually providing the closed loop configuration (i.e. by providing the same transfer function H(s) using other components and/or circuit layouts).

The filter 31 of the above embodiments may be implemented in the analogue or digital domains.

DETAILED EXAMPLES

Two example implementations in the digital domain are described, each comprising open loop transfer functions with feedback.

A digital, discrete time implementation of the open loop transfer function has the following form (in Z transform representation):

$$G(z) \approx \left(\dfrac{T^3}{2}\right)\left(\dfrac{(1+2z^{-1}+z^{-2})}{1-\left(2-\dfrac{1}{Q_p}(T\omega_p)+\left(\dfrac{1-2Q_p^2}{2Q_p^2}\right)(T\omega_p)^2\right)z^{-1}+\left(1-\dfrac{1}{Q_p}(T\omega_p)+\left(\dfrac{1}{2Q_p^2}\right)(T\omega_p)^2\right)z^{-2}}\right)$$

$$\left(\dfrac{(1-z^{-1}(1-T\omega_1))}{(1+z^{-1})}\right)\dfrac{1}{(1-z^{-1})^2}$$

with a simplifying assumption being made that $T\omega_z$, $T\omega_p \ll 1$. The full expression can also be derived but is considerably more complex.

In Example 1, $Q_p=0.5$ (real poles). In example 2, $Q_p=1$ (complex poles).

Example 2 has better roll-off characteristics than Example 1, but is more costly to implement in terms of area and power.

Define:

$T\omega_z = 2^{k_z}, k_z$ is an integer $T\omega_p = 2^{k_p}, k_p$ is an integer Note: in the following expressions, int(x) means the integer part of x.

Example 1—Real Poles Implementation

Figure 5:
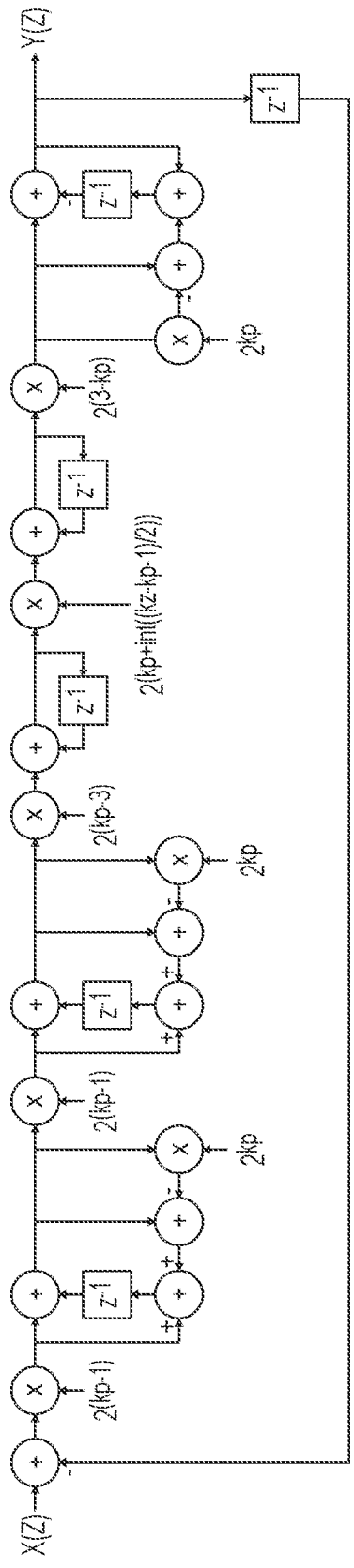
FIG. 5 depicts an implementation of a first example filter in the digital domain.

The circuit for Example 1 is depicted in FIG. 5. The open loop transfer function G(z) has the following form (in Z transform representation):

$$G(z) = \left[\dfrac{2^{(k_p-1)}(1+z^{-1})}{(1-z^{-1}(1-2^{k_p}))}\right]\cdot\left[\dfrac{2^{(k_p-1)}(1+z^{-1})}{(1-z^{-1}(1-2^{k_p}))}\right]\cdot$$

$$\left[\left(\dfrac{2^{(k_p-3)}}{(1-z^{-1})}\right)\right]\cdot\left[\left(\dfrac{2^{(k_p+int((k_z-k_p-1)/2))}}{(1-z^{-1})}\right)\right]\cdot\left[\dfrac{2^{(3-k_p)}(1-z^{-1}(1-2^{k_z}))}{(1+z^{-1})}\right]$$

Example 2—Complex Poles Implementation

Figure 6:
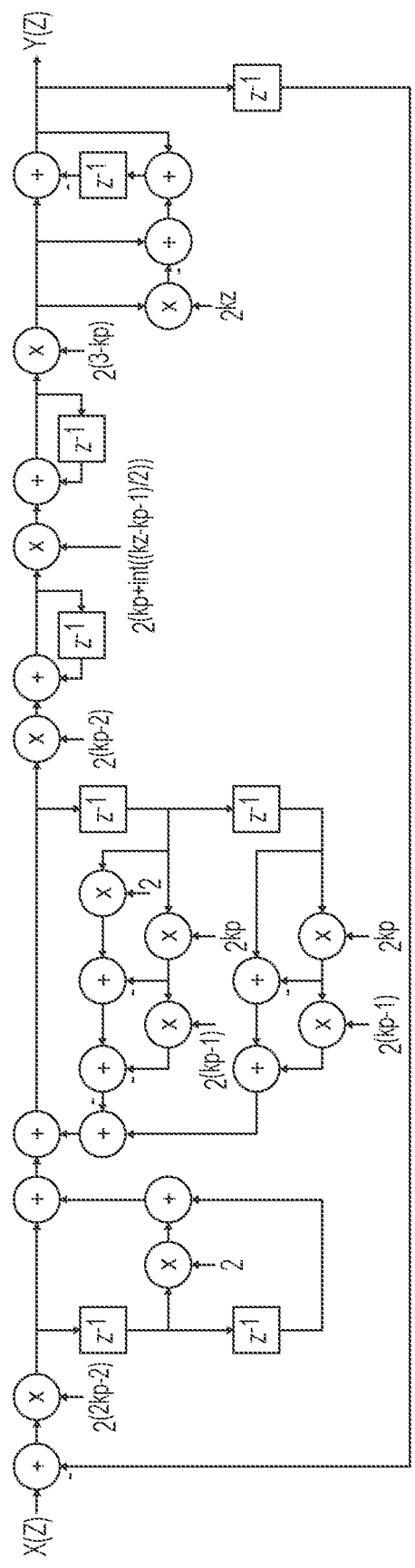
FIG. 6 depicts an implementation of a second example filter in the digital domain.

The circuit in Example 2 is depicted in FIG. 6. The open loop transfer function G(z) has the following form (in Z transform representation):

$$G(z) = \left[\dfrac{2^{(2k_p-2)}(1+2z^{-1}+z^{-2})}{(1-(2-2^{k_p}-2^{(2k_p-1)})z^{-1}+(1-2^{k_p}+2^{(2k_p-1)})z^{-2})}\right]\cdot$$

$$\left[\left(\dfrac{2^{(k_p-2)}}{(1-z^{-1})}\right)\right]\cdot\left[\left(\dfrac{2^{(k_p+int((k_z-k_p-1)/2))}}{(1-z^{-1})}\right)\right]\cdot\left[\dfrac{2^{(3-k_p)}(1-z^{-1}(1-2^{k_z}))}{(1+z^{-1})}\right]$$

Examples 1 and 2 both use implementations in which every multiplication is arranged to be a power of 2, which means that no multiplying hardware is involved.

We claim:

1. A temperature compensated oscillator, comprising:
   an oscillator circuit; and
   a temperature compensation module configured to reduce temperature induced errors in the frequency of oscillation of the oscillator by providing a temperature compensation signal to the oscillator circuit based on an output from a temperature sensor, wherein the temperature compensation module comprises a low pass filter configured to reduce noise in the temperature compensation signal, the low pass filter being such that, using Laplace representations of transfer functions, the transfer function H(s) of the filter is equivalent to the transfer function of a closed loop configuration in which a module having an open loop transfer function G(s) is configured to generate an output from the closed loop configuration by applying the open loop transfer function G(s) to an error between an input to the closed loop configuration and the output from the closed loop configuration, wherein G(s) comprises at least one pole at the origin and at least one pole that is not at the origin.

2. The oscillator of claim 1, wherein the low pass filter comprises said closed loop configuration.

3. The oscillator of claim 1, wherein the low pass filter is configured to implement H(s) without comprising said closed loop configuration.

4. The oscillator of claim 1, wherein G(s) comprises at least two poles at the origin.

5. The oscillator of claim 4, wherein G(s) comprises at least four poles in total.

6. The oscillator of claim 1, wherein G(s) comprises at least one zero.

7. The oscillator of claim 1, wherein G(s) comprises m poles at the origin and at least m−1 zeros, wherein m is an integer equal to or greater than 2.

8. The oscillator of claim 1, wherein $$G(s) = \frac{k}{s^m} \frac{\Pi_{i=1}^{(m-1)}(s - z_i)}{\Pi_{j=1}^{(n-m)}(s - p_j)}$$

wherein k is a constant, m is an integer representing the number of poles at the origin, n is an integer representing the number of poles in total, $z_i$ represents the position of each zero, and $p_j$ represents the position of each pole that is not at the origin.

9. The oscillator of claim 1, wherein the temperature compensation module further comprises a temperature compensation signal generation unit configured to generate the temperature compensation signal, and the low pass filter is positioned between the temperature sensor and the temperature compensation signal generation unit, such that the temperature compensation signal generation unit uses a filtered output from the temperature sensor to generate the temperature compensation signal that is provided to the oscillator circuit.

10. The oscillator of claim 1, wherein the temperature compensation module further comprises a temperature compensation signal generation unit configured to generate a first temperature compensation signal and the low pass filter is positioned between the temperature compensation signal generation unit and the oscillator circuit, such that the first temperature compensation signal is filtered by the low pass filter to generate a second temperature compensation signal that is provided to the oscillator circuit.

11. The oscillator of claim 1, wherein the low pass filter is implemented in the analogue domain.

12. The oscillator of claim 1, wherein the low pass filter is implemented in the digital domain.

13. The oscillator of claim 1, wherein the oscillator comprises a piezoelectric resonator coupled to the oscillator circuit.

14. The oscillator of claim 1, wherein the piezoelectric resonator comprises a quartz crystal.

* * * * *